United States Patent [19]

Okada et al.

[11] B 3,919,567

[45] Nov. 11, 1975

[54] SIGNAL GATE CIRCUIT

[75] Inventors: Takashi Okada, Yamato; Kimitake Utsunomiya, Tokyo, both of Japan

[73] Assignee: Sony Corporation, Tokyo, Japan

[22] Filed: Sept. 21, 1973

[21] Appl. No.: 399,304

[44] Published under the Trial Voluntary Protest Program on January 28, 1975 as document no. B 399,304.

[30] Foreign Application Priority Data

Sept. 22, 1972 Japan .............................. 47-110350

[52] U.S. Cl. ............... 307/254; 307/296; 330/30 D

[51] Int. Cl.² .......................................... H03K 17/00

[58] Field of Search .................. 330/30 D; 340/166; 307/254, 296

[56] References Cited

UNITED STATES PATENTS

| | | | |
|---|---|---|---|
| 3,550,087 | 12/1970 | Ross et al. | 330/30 D |
| 3,733,562 | 5/1973 | Cecchin et al. | 330/30 D |
| 3,781,701 | 12/1973 | Cecchin et al. | 330/30 D |

*Primary Examiner*—John Zazworsky
*Assistant Examiner*—B. P. Davis
*Attorney, Agent, or Firm*—Lewis H. Eslinger; Alvin Sinderbrand

[57] ABSTRACT

A differential circuit including first and second differentially connected semiconductor devices and a third semiconductor device connected in series between the common terminal of the differentially connected devices and one of the power supply terminals. The series connected device is non-conductive between gating pulses, so no current flows through any of the semiconductor devices except during gating pulses. The information signal to be gated is applied to the series-connected device, and the gating signal is also applied to this device and to one of the differentially connected semiconductor devices. For at least part of each gating pulse, the signal to be gated is amplified by both the series-connected device and one of the differentially connected devices. At the beginning and end of each pulse, the other differentially connected device may be conductive to act as a virtual short circuit to prevent the one differentially connected device from amplifying any signals which are within a gating pulse interval but are not supposed to pass through the gate circuit.

5 Claims, 10 Drawing Figures

PRIOR ART

FIG. 6A
FIG. 6B
FIG. 6C
FIG. 6D
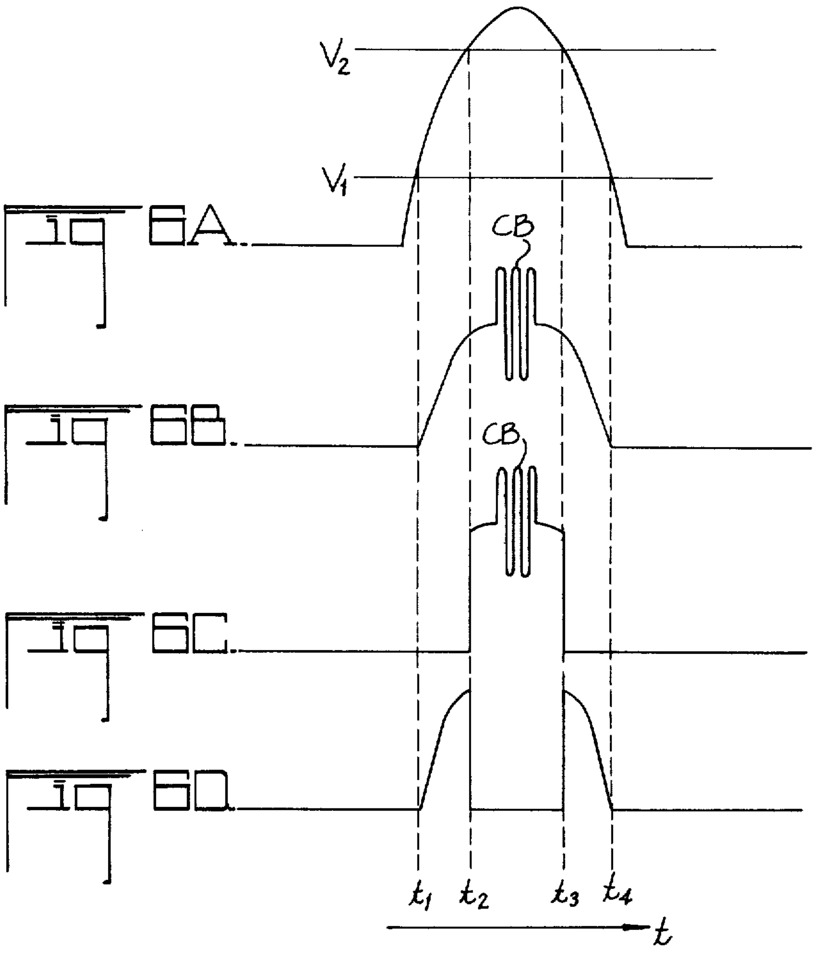
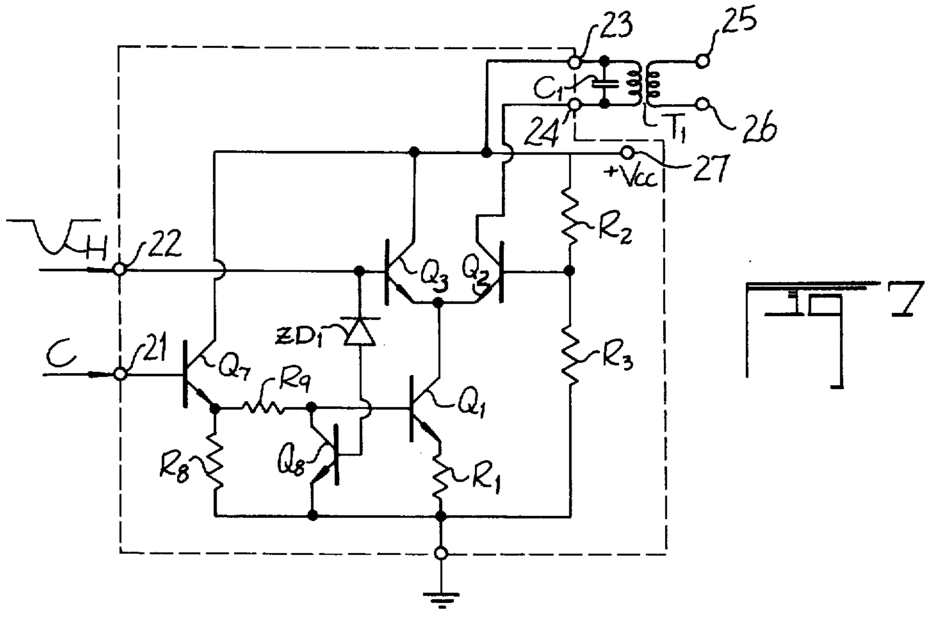
FIG. 7

SIGNAL GATE CIRCUIT

BACKGROUND OF THE INVENTION

1. Field of the Invention

This invention relates to the field of differential gate circuits and particularly to the field of circuits for gating burst signals in television apparatus.

2. The Prior Art

Gate circuits are used to select certain information signals out of a series of such signals and to make this selection on the basis of the time that the selected signal occur. These circuits are very useful in television receivers to select burst signals out of a complete color television signal. Burst signals occur at a known time in each horizontal blanking interval, and it is relatively easy to generate a gating pulse to be applied to a gate circuit to cause the gate circuit to pass burst signals. The burst signals are then used to control the frequency and phase of a local oscillator that is used in reproducing color signals.

The color signal between gate pulses is not supposed to pass through the gate circuit, because the color signal contains components that can cause the local oscillator to produce a signal that has the wrong phase. Hence, any leakage of signal through the gate circuit when the gate circuit is not supposed to be conductive to signals is very undesirable. If the gating pulses were rectangular and of precisely the correct timing and duration, leakage might be prevented more easily, but typical gating pulses have sloping leading and lagging edges that may make it possible for some undesired information signals to pass through the gate circuit at the beginning and end of each gating pulse.

The basic arrangement of differential gate circuits of the type in use at the present time includes three transistors. The emitters of two of these transistors are connected together and are also connected to the collector of the third transistor. The first two transistors are referred to as differentially connected transistors because the circuit is designed to operate in such a way that the current through the first transistor increases as the current through the second transistor decreases. The reverse operation is also true. Since the third transistor is connected in series with the differentially connected pair, current through either the first or second transistor must flow through the series-connected transistor.

In some existing differential gate circuits the information signal to be gated is applied to the first differentially connected transistor, and the gated signal output terminal is connected to the output circuit of the same transistor. The series-connected third transistor is controlled by a gating signal that allows all three transistors to be conductive only during each gating pulse.

Differential gate circuits of this type have excessive leakage of the information signals from the input terminal to the output terminal at those times between gating pulses when the path was supposed to be non-conductive to such signals. This leakage is due to the fact that there is only a single nonconductive transistor in the signal path. Stray capacitance inevitably furnishes an extra path around a non-conductive transistor and although the signal is attenuated in passing through this extra path, the leakage current can still be too large.

The signal leakage is reduced in other existing gate circuits by connecting the information signal to the series-connected transistor and gating the first differentially connected transistor, which is the one that amplifies the output signal of the series-connected transistor. The second differentially connected transistor is conductive during intervals between gating pulses and virtually short circuits the output signal of the series-connected transistor during those intervals. During intervals between gating pulses, any leakage signal would have to follow a path of stray capacitances around the non-conductive, series-connected transistor and around the non-conductive, first, differentially connected transistor. The attenuation of leakage current in such a path is great and the output terminal is better isolated from the input terminal. However, at least one or the other of the differentially connected transistors is always conductive, along with the series-connected transistor device, and this results in an undesirably high average power consumption with a correspondingly high amount of heat to be dissipated. These circuits are to be constructed in integrated circuit form, and it is desirable to minimize heat dissipation in integrated circuits.

SUMMARY OF THE INVENTION

In accordance with the present invention a differential circuit is used to gate an information signal. The latter signal is applied to a first transistor, or semiconductor device, connected in series with two differentially connected semiconductor devices, one of which is gated by a gating signal. The first semiconductor device not only amplifies the information signal, but it is also connected to be gated by the gating signal so that it is non-conductive, and therefore is inoperative as an amplifier, except during the gated intervals of the gating signal. Since this semiconductor device is connected in series with each of the differentially connected semiconductor devices, both of the latter devices are also non-conductive except during the gated intervals.

One of the differentially connected semiconductor devices is connected so as to amplify further the output information signal of the series-connected conductor device during the gated intervals. The second differentially connected semiconductor device is biased so that it becomes conductive before the first differentially connected device does when the gating signal causes the series-connected semiconductor device to become conductive. When the second differentially connected semiconductor device becomes conductive, it virtually short circuits the output signal of the series-connected semiconductive device until the gating signal applied to the first differentially connected semiconductor device reaches the voltage level necessary to cause that device to become conductive. Differential operation then transfers the state of conductivity from the second to the first differentially connected semiconductor device, which then amplifies the information signal from the series-connected semiconductor device.

As a result of the successive gating and differential transfer of conductivity, the information signal is isolated from the output terminal by two semiconductor devices during intervals between gating signals and even prevents the flow of undesired information signals just after the beginning and just before the end of each non-rectangular gating pulse.

BRIEF DESCRIPTION OF THE DRAWINGS

FIGS. 6A–6D are waveforms that represent the operation of the circuit in FIG. 5.

FIG. 7 is a schematic diagram of another embodiment of the invention.

DETAILED DESCRIPTION OF THE INVENTION

Figure 1:
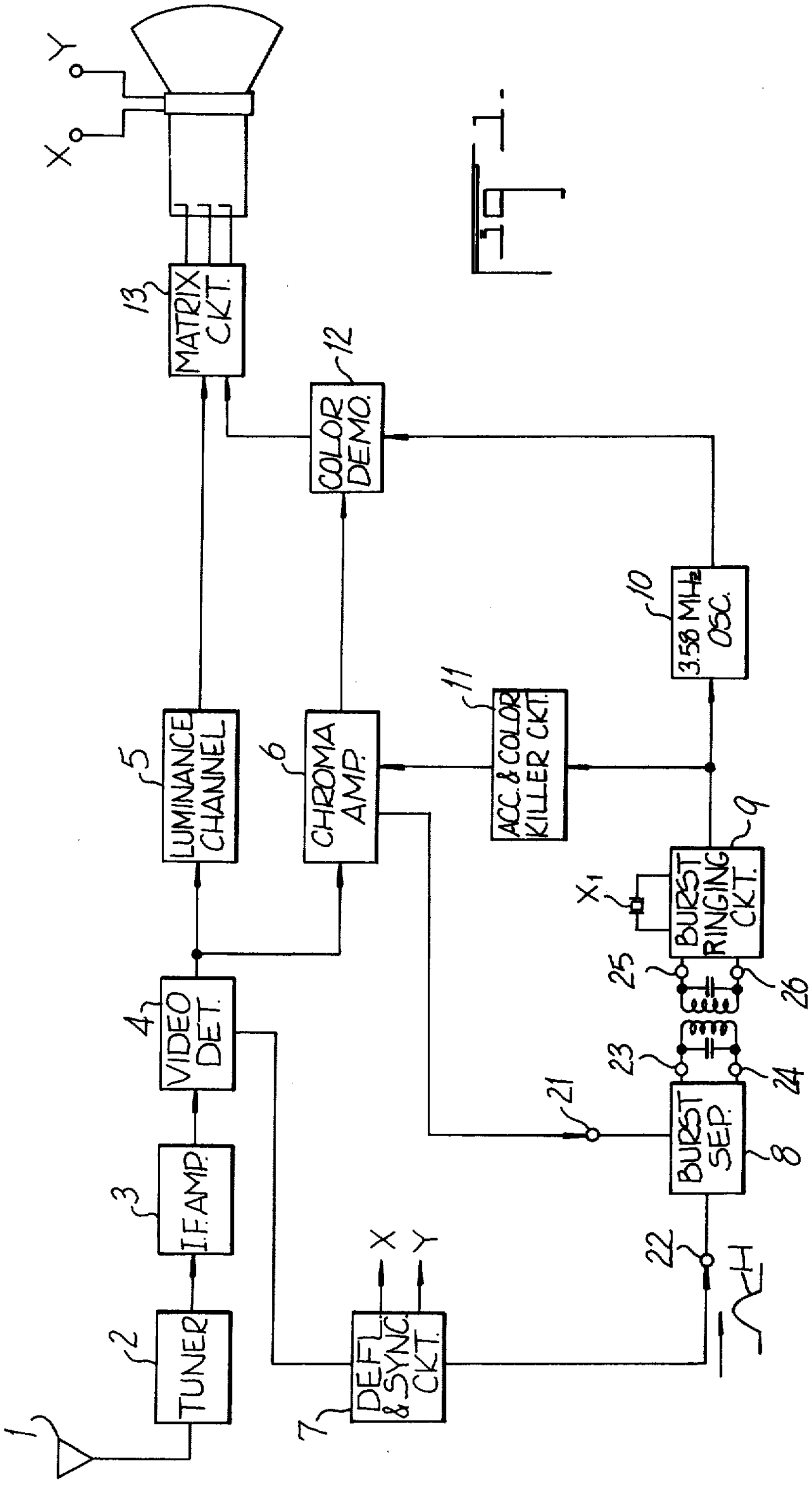
FIG. 1 is a block diagram of the sections of a color television receiver that relate to the operation of the circuit of this invention.

The color television receiver components illustrated in FIG. 1 include an antenna 1 connected to a tuner 2 that selects the television channel to be viewed. The output of the tuner is connected to an i.f. amplifier 3 that supplies signals to a video detector 4. One output of the detector 4 is connected to a luminance signal channel 5 and to a chrominance amplifier 6 in a chrominance channel. The detector 4 also supplies signals to a synchronizing signal separator and deflecting circuit 7. This circuit supplies horizontal and vertical deflection signal via circuits X and Y to a deflection yoke on a cathode ray picture tube.

This invention deals with a gate circuit such as may be used for a burst separator 8. This circuit receives an information signal in the form of the chrominance signal from the chrominance amplifier 6 and gating signal H from the synchronizing signal separator circuit 7.

The output of the burst separator 8 is connected to a burst ringing circuit 9 in which a sharply tuned circuit including a crystal $X_1$ changes the intermittent bursts to a more continuous signal. This signal is used to control the frequency of oscillations generated by an oscillator 10. The output of the burst ringing circuit 9 is also connected to automatic color control and color killer circuits 11 that control the operation on the chrominance amplifier 6. The controlled output of the chrominance amplifier is applied to a color demodulator 12 that also receives the controlled signal from the oscillator 10 to demodulate the chrominance signals. The demodulated signals are applied along with the luminance signals from the luminance channel 5 to a matrix circuit 13 to produce separate red, green, and blue color signals. These are applied to a color cathode ray picture tube, to generate a color television image.

Figure 2:
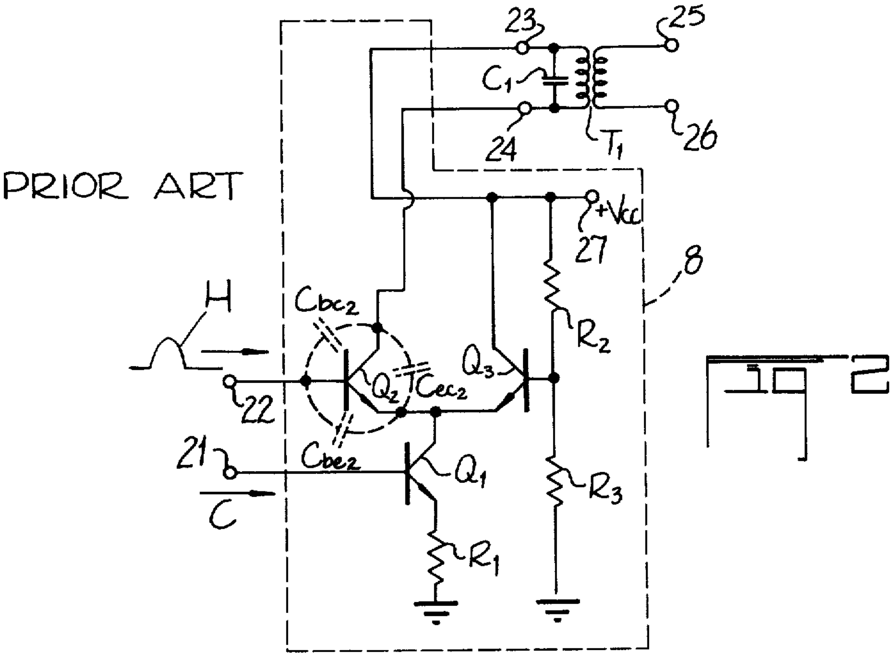
FIG. 2 PRIOR ART
FIGS. 2 and 3 are schematic diagrams of prior art gate circuits.

FIG. 2 shows one type of prior art gate circuit 8 used in the receiver of FIG. 1. This circuit receives a chrominance signal C as the information signal at an information signal input terminal 21. This terminal is connected to the base of transistor $Q_1$ that has its emitter connected to ground through a resistor and its collector connected directly to the emitters of the two differentially connected transistors $Q_2$ and $Q_3$.

The gating pulse signal H is applied to a gating pulse signal input terminal 22, which is connected to the base of the transistor $Q_2$. The output signal of the circuit 8 is between two terminals 23 and 24, and the primary of a transformer $T_1$ is connected across these terminals. A capacitor $C_1$ tunes the transformer, and output terminals 25 and 26 are connected to the ends of the secondary. The direct current to operate the circuit is supplied across two power supply terminals, one of which is indicated by reference numeral 27 and the other of which is the ground terminal.

During operation of the circuit in FIG. 2 the bias voltages on the three transistors are such that the transistors $Q_1$ and $Q_3$ are conductive but the transistor $Q_2$ is normally non-conductive. Information circuits C applied to the input terminal 21 are amplified by the transistor $Q_2$ only when a gating pulse H makes that transistor conductive. When the transistor $Q_2$ becomes conductive, differential operation of the transistors $Q_2$ and $Q_3$ causes the latter to become non-conductive. Between the pulses H, the transistor $Q_2$ is non-conductive and is, therefore, unable to amplify any signal at the collector of the series-connected transistor $Q_1$. Furthermore, when the transistor $Q_2$ is non-conductive, differential operation makes the transistor $Q_3$ conductive and causes the impedance at the signal frequency seen from the collector of the transistor $Q_1$ to be so small that any information signal current would be quite small in traversing any path furnished by the stray capacitance $C_{ec2}$ between the emitter and collector of the transistor $Q_2$ or the stray base-emitter capacitance $C_{be2}$ in series with the stray base-collector capacitance $C_{bc2}$.

The circuit in FIG. 2 does have a very undesirable disadvantage. Direct current is always flowing through the transistor $Q_1$ and either the transistor $Q_3$ or the transistor $Q_2$. This direct current is undesirable in portable receivers and in integrated circuits, which makes this circuit unsatisfactory for these purposes.

Figure 3:
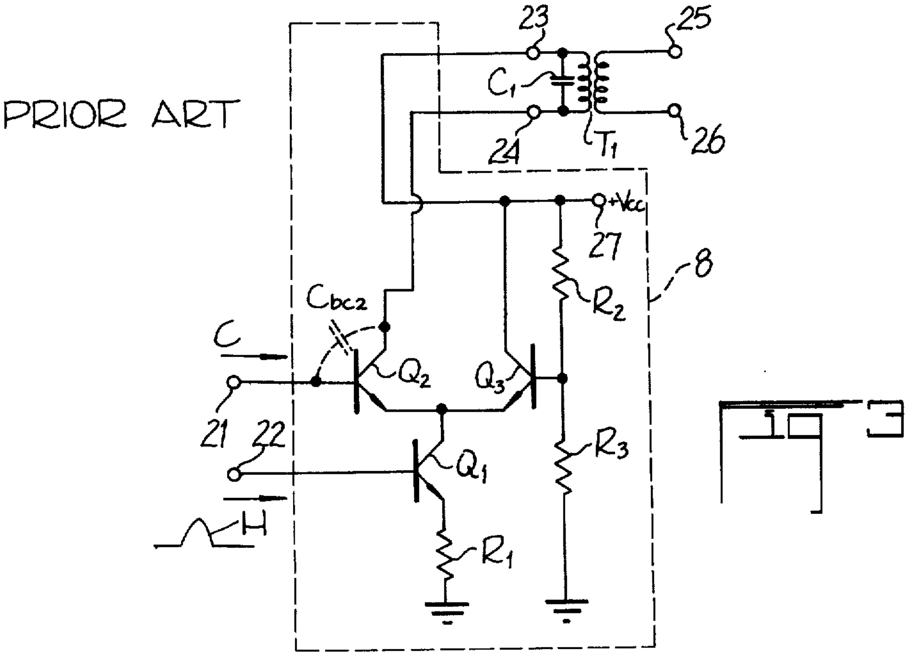

The circuit in FIG. 3 is similar to that in FIG. 2 except that the input terminals 21 and 22 are reversed and the transistor $Q_1$ is biased to be normally non-conductive while the transistor $Q_2$ is biased so that it would be normally conductive if the series-connected transistor $Q_1$ would allow current to flow through it.

In operation, the gating signal H is applied to the gating signal input terminal 22 to make the transistor $Q_1$ conductive. This also permits the transistor $Q_2$ to amplify the information signal C applied to the input terminal 21. Between gating pulses, the transistor $Q_1$ is non-conductive and so no current can flow through either of the differentially connected transistors $Q_2$ and $Q_3$. This greatly reduces the average current through the circuit and, therefore, the heat dissipation, but it is possible for leakage current to by-pass the non-conducting transistor $Q_2$ by flowing from the input terminal 21 to the output terminal 24 by way of the stray capacitance $C_{bc2}$.

Figure 4:
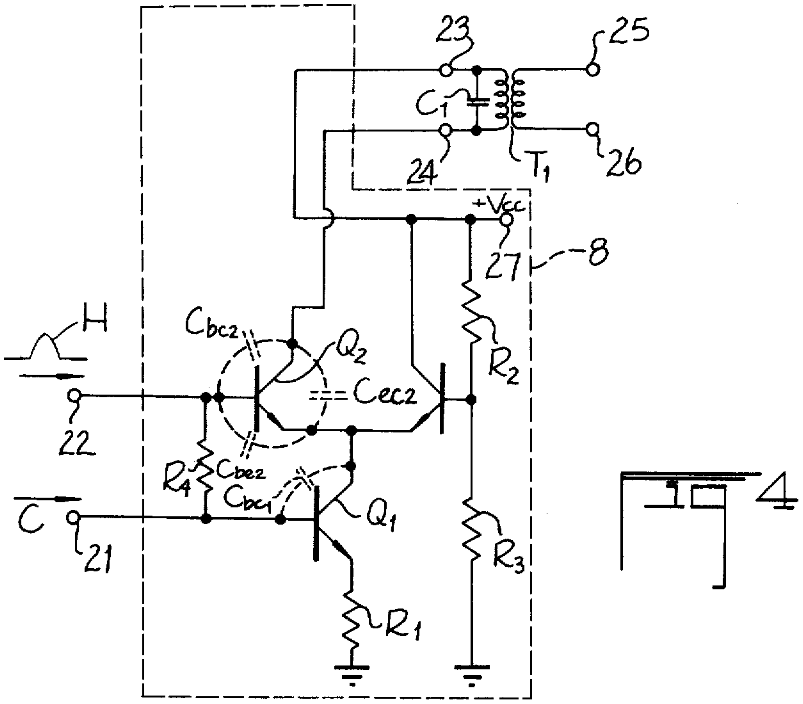
FIGS. 4 and 5 are schematic diagrams of gate circuits according to the present invention.

FIG. 4 shows a basic embodiment of the present invention. Many of the components are the same as in the circuits in FIGS. 2 and 3. The important differences are that the information signal input terminal 21 is connected to the base input electrode of the series-connected semiconductor transistor $Q_1$, which is biased to be normally non-conductive; the gating signal input terminal 22 is connected to the base input electrode of one of the differentially connected semiconductor devices, transistor $Q_2$, which is also normally non-conductive; and a circuit comprising a resistor $R_4$ connects the input electrodes of the transistors $Q_1$ and $Q_2$.

In operation, the emitter-collector output circuit of the transistor $Q_1$ is normally non-conductive. This prevents any direct current from flowing through the emitter-collector output circuit of either of the transistors $Q_2$ or $Q_3$. In order for the information signal C applied to the input terminal 21 to produce any current from the output terminal 24 under such conditions, a leakage current would be required to flow through the stray capacitance $C_{bc1}$ and either the stray capacitance $C_{ec2}$ or the stray capacitances $C_{be2}$ and $C_{bc2}$) The leakage current would, therefore, be attenuated.

When the gating signal H is applied to the terminal 22, it raises the bias on the base of the transistor $Q_1$ to the level at which this transistor conducts which allows current to flow through the transistors $Q_1$ and $Q_3$. As the gating signal H continues to rise, the transistor $Q_2$ becomes conductive and causes the transistor $Q_3$ to become non-conductive. Then the information signal C applied to the input terminal 21 will be amplified by the transistors $Q_1$ and $Q_2$ and applied to the primary of the transformer $T_1$ by way of the output terminal 24 and the common terminal 23.

It is clear that the circuit in FIG. 4 has the important low average current feature of the circuit in FIG. 3 and it also has the low leakage current feature of the circuit in FIG. 2, but it does not have the disadvantages of either of the prior art circuits.

Figure 5:
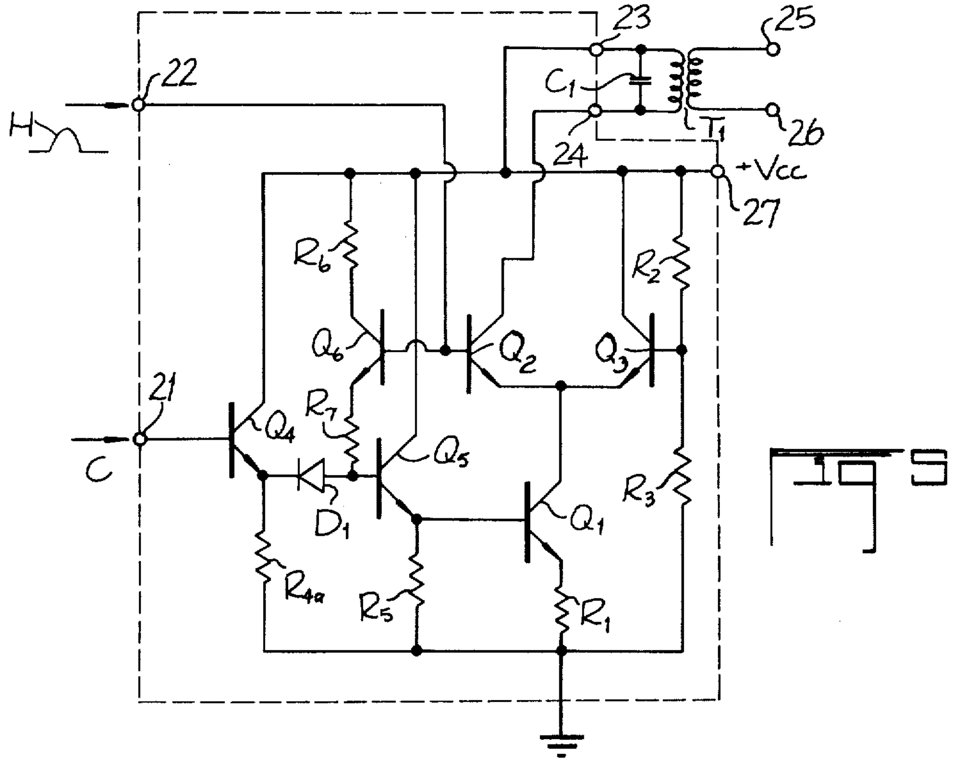

FIG. 5 shows a modified embodiment of the invention, and again, components similar to those in prior circuits are identified by the same reference characters. Instead of being connected directly to the base of the transistor $Q_1$, the information signal input terminal 21 is connected to the base input electrode of a transistor $Q_4$ connected as an emitter follower with an emitter load resistor $R_4$. A diode $D_1$ connects the emitter of the transistor $Q_4$ to the base of another transistor $Q_5$, which is also connected as an emitter follower and has an emitter load resistor $R_5$. The gating signal input terminal 22 is connected to the base of a transistor $Q_6$ in addition to being connected to the base of the transistor $Q_2$. A resistor $R_6$ is connected between the collector of the transistor $Q_6$ and the power supply terminal 27, and another resistor $R_7$ is connected between the emitter of the transistor $Q_6$ and the base of the transistor $Q_5$.

The operation of the circuit in FIG. 5 will be described with reference to the waveforms in FIGS. 6A–6D. Initially, the diode $D_1$ and all of the transistors except the transistor $Q_4$ are non-conductive. Thus, the information signal C applied to the input terminal 21 is separated from the output terminal 24 by the diode $D_1$ and the transistors $Q_5$, $Q_1$ and $Q_2$, all of which are non-conductive. This isolates the terminals 21 and 24 from each other even more than the same terminals in the circuit in FIG. 4.

FIG. 6A shows the waveform of the gating signal H as it is applied to the input terminal 22. The transistors $Q_6$, $Q_5$ and $Q_1$ all become conductive by the time the signal H reaches the voltage level $V_1$. This occurs at the time $t_1$. As the signal H continues to increase, current through the emitter-collector circuit of the transistor $Q_1$ increases, as shown in the waveform in FIG. 6B. The transistor $Q_2$ is non-conductive at this time and the current through the emitter-collector output circuit of the transistor $Q_1$ must flow through the emitter-collector output circuit of the transistor $Q_3$, as shown in the waveform in FIG. 6D.

When the gating signal H reaches the level $V_2$, the transistor $Q_2$ becomes conductive and a further increase in the voltage H causes the conductivity in the differential circuit to shift from the transistor $Q_3$ to the transistor $Q_2$. In actual practice, this differential operation is likely not to happen as instantaneously as it appears to do in FIGS. 6C and 6D. FIG. 6C illustrates the current flow through the emitter-collector circuit of the transistor $Q_2$. However, the transistor $Q_2$ does conduct only during the central part of the pulse H between the times $t_2$ and $t_3$. From the time $t_3$ until the time $t_4$, the transistor $Q_2$ is non-conductive and the transistor $Q_3$ is conductive.

The reason for the operating sequence just described is that burst signals are located on what is known as the back porch of horizontal blanking signals. The total duration of each gating pulse H may be greater than the time required for the back porch of the horizontal blanking signal. Preceding the back porch is the horizontal synchronizing signal, which has no component with the same frequency as the burst signal and, therefore, is not likely to cause trouble in synchronizing the oscillator 10. However, if the signal H has a duration long enough to keep the transistor $Q_1$, $Q_5$, and $Q_6$ conductive after the horizontal blanking interval has ended, which is likely to happen, it would be possible for undesired chrominance signal components in the formation signal C applied to the input terminal 21 to reach the output terminal 24.

The level $V_2$ of the pulse H at which the transistor $Q_2$ becomes non-conductive as the amplitude of the pulse decreases is selected so that the transistor $Q_2$ will be non-conductive and the transistor $Q_3$ will become conductive again before the horizontal signal ends. Even if the horizontal blanking interval ends between the times $t_3$ and $t_4$ shown in FIG. 6D, the transistor $Q_3$ will be conductive and will bypass the information signal. The transistor $Q_2$ will be non-conductive, so very little leakage signal will reach the output terminal 24, and even that low amplitude leakage signal will end at the time $t_4$ when the transistor $Q_1$ becomes non-conductive along with the transistor $Q_5$, the diode $D_1$ and the transistor $Q_6$.

Typical parameters for the circuit in FIG. 5 are as follows:

| | |
|---|---|
| $R_1$ | 150 ohms |
| $R_2$ | 4.3K |
| $R_3$ | 2.2K |
| $R_4$ | 1K |
| $R_5$ | 1.5K |
| $R_6$ | 1K |
| $R_7$ | 5.1K |
| $C_1$ | 68pF |
| $V_{cc}$ | 12 volts. |

FIG. 7 shows another embodiment of the invention in which the polarity of the gating signal H is negative rather than positive as it has been in the embodiments discussed previously. In FIG. 7 the input terminal 21 is connected to the base of the transistor $Q_7$ that is connected as an emitter follower and has an emitter load $R_8$. A resistor $R_9$ couples the emitter of the transistor $Q_7$ to the base of the transistor $Q_1$. The emitter-collector output circuit of a switching transistor $Q_8$ is connected directly between the base of the transistor $Q_1$ and ground. The base of the transistor $Q_8$ is connected through a zener diode $ZD_1$ to the base of the transistor $Q_3$.

In this embodiment, the gating signal input terminal 22 is connected directly to the base of the transistor $Q_3$ rather than to the base of the transistor $Q_2$ as in previous embodiments. The emitters of the transistors $Q_2$ and $Q_3$ are connected directly to the collector of the transistor $Q_1$, as they have been heretofore, and the collector of the transistor $Q_2$ is connected directly to the output terminal 24 which, together with the terminal 23, supplies the output signal to the primary of the transformer $T_1$. The base of the transistor $Q_2$ is biased by being connected to the common junction between two resistors $R_2$ and $R_3$ that are connected as a voltage divider between the power supply terminal 27 and ground.

In operation, the quiescent voltage level applied to the input terminal 22 between the gating pulses H is sufficiently positive to make the transistor $Q_8$ conductive through the zener diode $ZD_1$. The transistor $Q_7$ is also initially conductive, but its output signal, which is the information signal C, is applied across a voltage divider comprising the resistor $R_9$ and the emitter-collector output circuit of the transistor $Q_8$. When the latter is conductive, the impedance of its output circuit is very low, and thus the fraction of the signal voltage at the emitter of the transistor $Q_7$ that is transferred to the base of the transistor $Q_1$ is very low. The transistor $Q_1$ is non-conductive at this time by virtue of the low impedance of the output circuit of the transistor $Q_8$ connected between the base of the transistor $Q_1$ and ground. This not only prevents the transistor $Q_1$ from acting as an amplifier for such information signal as might exist across the emitter-collector output circuit of the transistor $Q_8$, but it also makes both of the transistors $Q_2$ and $Q_3$ non-conductive and keeps the transistor $Q_2$ from amplifying signals to be applied to the output terminal 24. The input terminal 21 is well isolated from the output terminal 24. Two of the transistors $Q_7$ and $Q_8$ are conductive between the gating pulses H, but these transistors are at the input side of the circuit and their average current is therefore relatively low.

When the gating pulse H is applied to the input terminal 22, the relatively fixed voltage across the zener diodes $ZD_1$ is maintained and causes the voltage at the base of the transistor $Q_8$ to drop at the same rate as the pulse H. The voltage at the base of the transistor $Q_3$ is high enough so that transistor would be conductive if it were possible for the current flowing through the emitter-collector output circuit of that transistor to flow through the transistor $Q_1$. When the voltage at the base of the transistor $Q_8$ reaches the level at which the transistor $Q_8$ is no longer conductive, the transistor $Q_1$ is able to become conductive. Current can then flow through the emitter-collector circuits of the transistors $Q_1$ and $Q_3$ until the gating pulse H reaches a level low enough to cause the transistor $Q_3$ to become non-conductive. Differential operation then transfers conductivity to the transistor $Q_2$, and that transistor is able to amplify the input signal that had passed through the transistors $Q_7$ and $Q_1$ and is available at the collector of the transistor $Q_1$.

After the pulse H has reached its most negative level and starts to become positive, the voltage applied to the base of the transistor $Q_3$ reaches the level of conductivity and, by differential operation, causes the transistor $Q_2$ to become non-conductive, which prevents the passage of any substantial amount of signal to the output terminal 24. There would be some leakage signal by way of stray capacitances around the transistor $Q_2$, but any such leakage signal is effectively short circuited by the conductive transistor $Q_3$. This reduces considerably the leakage signal at the output terminal 24. As the voltage of the gating pulse H continues to increase toward its quiescent level, a level is reached such that the transistor $Q_8$ again becomes conductive and makes the transistor $Q_1$ non-conductive. This further reduces the possibility of leakage signal reaching the output terminal 24 until the next gating pulse is received at the input terminal 22.

Typical parameters for the circuit in FIG. 7 are as follows:

| | |
|---|---|
| $R_1$ | 330 ohms |
| $R_2$ | 6.8K |
| $R_3$ | 5.1K |

-continued

| | |
|---|---|
| $R_8$ | 2K |
| $R_9$ | 1K |
| $C_1$ | 68pF |
| $V_{cc}$ | 12 volts. |

What is claimed is:

1. A gate circuit comprising:

A. an information signal input terminal;

B. a gate signal input terminal;

C. a differential circuit comprising first, second and third semiconductor devices, each having first, second and third electrodes;

D. first and second power-supply terminals;

E. first circuit means connecting the first electrode of said first semiconductor device to said information signal input terminal;

F. second circuit means connecting the second electrode of said first semiconductor device to said second power supply terminal;

G. third circuit means connecting the first electrode of one of said second and third semiconductor devices to said gate signal input terminal;

H. biasing means connected to the first electrode of the other of said second and third semiconductor devices to bias the same to a normally conductive state;

I. fourth circuit means connecting the second electrodes of said second and third semiconductor devices to the third electrode of said first semiconductor device;

J. an output terminal connected to the third electrode of said second semiconductor device;

K. fifth circuit means connecting the third electrode of said third semiconductor device to said first power supply terminal; and L. sixth circuit means connecting said gate signal input terminal to said first semiconductor device, whereby both said first and second semiconductor devices are made conductive during at least a portion of said gate signal and are made non-conductive between successive gate signals.

2. The gate circuit of claim 1 in which said third circuit means connects the first electrode of said second semiconductor device to said gate signal input terminal and said biasing means is connected to the first electrode of said third semiconductor device, whereby said third semiconductor device becomes conductive at a lower level of the gate signal then said second semiconductor device.

3. The gate circuit of claim 2 in which said sixth circuit means is a resistor.

4. The gate circuit of claim 2 in which:

A. said first circuit means comprises:

1. a diode; and 2. a fourth semiconductor device connected as an amplifier between said diode and said first semiconductor device; and B. said sixth circuit means comprises a fifth semiconductor device connected to said gate signal input terminal and to the common connection between said diode and said fourth semiconductor device.

5. The gate circuit of claim 1 in which said third circuit means connects said first electrode of said third semiconductor device to said gate signal input terminal and said gate signal is polarized to drive said third semiconductor device to become non-conductive.

* * * * *